United States Patent
Dueme et al.

(10) Patent No.: US 6,798,281 B2
(45) Date of Patent: Sep. 28, 2004

(54) TWO-INPUT/TWO-OUTPUT BROADBAND ACTIVE SELECTOR SWITCH WITH DISTRIBUTED STRUCTURE, AND PHASE CONTROL DEVICE COMPRISING SUCH A SWITCH

(75) Inventors: Philippe Dueme, Orsay (FR); Gilles Guerbeur, Chaville (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/319,823

(22) Filed: Dec. 16, 2002

(65) Prior Publication Data

US 2004/0036523 A1 Feb. 26, 2004

(30) Foreign Application Priority Data

Dec. 18, 2001 (FR) .............................................. 01 16394

(51) Int. Cl.[7] .............................. H03F 1/14; H03F 3/60; H03F 1/22
(52) U.S. Cl. .......................... 330/51; 330/286; 330/311
(58) Field of Search ........................... 330/51, 54, 286, 330/295, 311

(56) References Cited

U.S. PATENT DOCUMENTS

| | | | |
|---|---|---|---|
| 4,772,858 A | 9/1988 | Tsukii et al. ................ 330/277 |
| 4,973,918 A | 11/1990 | Schindler ..................... 330/277 |
| 5,070,304 A | * 12/1991 | Salib et al. ................... 330/54 |
| 5,168,242 A | * 12/1992 | Willems et al. ............... 330/54 |
| 2003/0184383 A1 | * 10/2003 | Ogawa ........................ 330/286 |

FOREIGN PATENT DOCUMENTS

EP 1017171 7/2000

* cited by examiner

Primary Examiner—Steven J. Mottola
(74) Attorney, Agent, or Firm—Lowe Hauptman Gilman & Berner, LLP

(57) ABSTRACT

An active selector switch with two inputs and two outputs comprises two parts, each part comprising a distributed amplifier whose elementary cells comprise at least two cascode-mounted transistors ($Q_1$ $Q_2$, $Q'_1$ $Q'_2$), one transistor ($Q_3$, $Q'_3$) controlled through the gate line (Lgc1) of the amplifier being associated with each cell, the associated transistor ($Q_3$) of the first part controlling the state of the common-gate transistor ($Q'_1$) of the second part and the associated transistor ($Q'_3$) of the second part controlling the state of the common-gate transistor ($Q_1$) of the first part, the two inputs ($E_1$, $E_2$) of the selector switch being the free ends of the gate lines (Ldc1) of the two distributed amplifiers (41, 42) and the outputs ($S_1$, $S_2$) of the selector switch being the free ends of these two amplifiers. The invention can be applied especially to digitally controlled phase control devices.

8 Claims, 5 Drawing Sheets

TWO-INPUT/TWO-OUTPUT BROADBAND ACTIVE SELECTOR SWITCH WITH DISTRIBUTED STRUCTURE, AND PHASE CONTROL DEVICE COMPRISING SUCH A SWITCH

BACKGROUND OF THE INVENTION

1. Field of the Invention

The present invention relates to a two-input/two-output active selector switch with distributed structure. The invention can be applied especially to digitally controlled phase control devices. These devices are used for example in telecommunications or in broadband microwave instrumentation. They are also used particularly in electronically scanned type antennas. The invention belongs especially to the field of microwave microelectronics and more particularly to the technology of microwave monolithic integrated microcircuits (MMIC).

A digitally controlled phase control device generally works on the basis of selection switching between at least two different channels, each capable of behaving either as a phase-shifter or as a line with programmable length. In practice in a phase shifter, between two states, the signal undergoes a phase shift in transmission where the value of the phase shift is constant in the frequency band considered. However, in a line of programmable length, between two states, the signal undergoes a phase shift in transmission where the value of the phase shift corresponds to the propagation of the current along a line of constant length (implying a constant delay) in the frequency band considered.

2. Description of the Prior Art

It is known that a phase control device comprises a digitally controlled input and, between a signal input and a signal output, at least one cell comprising passive selector switch means which are capable, under the control of a command input bit, of providing at least two different transfer functions in terms of temporal phase and/or delay. A phase control device of this kind can be implemented by means of a microwave monolithic integrated circuit (MMIC) technology in a frequency band ranging for example from 2 GHz to 18 GHz. However, the serial connection of several cells made entirely with MMIC technology leads to relatively great insertion losses. Indeed, a passive selector switch working in the frequency band that goes, for example, up to several tens of GHz is capable, in insertion, of losing 1 to 2 dB depending on the insulation.

Similarly, a phase-shift or delay cell may show losses of up to 2 dB for the medium significant bits (or mid-position bits) and the most significant bits. Thus, the making by MMIC technology of a line with a programmable length of 9 bits comprising 9 series-connected cells of the same structure may lead to insertion losses of between 30 and 40 dB.

This problem of insertion losses may be resolved by the use of active selector switches with distributed structure as described in the French patent application 98 16556. The active selector switches however have the advantage of combining the amplification function and the selection-switching function in overcoming the losses of a passive selector switch. These active selector switches are either switches with two inputs and one output, or switches with one input and two outputs.

SUMMARY OF THE INVENTION

It is an aim of the invention especially to enable the making of active selector switches with two input and two outputs. To this end, an object of the invention is an active selector switch comprising two distributed dual amplifiers. Each dual amplifier has an upper amplifier and a lower amplifier each having a drain line and a gate line that are common to them, the input $E_1$, $E_2$ of an amplifier being the free (or unconnected) end of its gate line and its output being the free end of its drain line, the inputs of the amplifiers forming the two inputs $E_1$, $E_2$ of the selector switch, the output of the two upper amplifiers being connected to form the first output $S_1$ of the selector switch, the outputs of the two lower amplifiers being connected to form the second output $S_2$ of the selector switch, the routing of the signal from an input to an output being controlled by the state of the amplifiers.

In another embodiment, a selector switch according to the invention comprises two parts, each part comprising a distributed-structure amplifier whose elementary cells comprise at least two cascode-mounted transistors. The state of each transistor in common source connection is controlled by applying the control voltage to its gate. The signal coming from one of the common-source transistors (the one switched over into the "on" state) is then directed toward the common-gate transistor which is common to both common-source transistors in a shared cascode structure. The two inputs $E_1$, $E_2$ of the selector switch are the free ends of the gate lines of the two distributed transistors and the outputs $S_1$, $S_2$ of the selector switch are the free ends of these two amplifiers.

An object of the invention is also a phase control device comprising a selector switch of this kind.

The main advantage of the invention is that it enables the making of a two-input and two-output active selector switch that is both compact and economical.

BRIEF DESCRIPTION OF THE DRAWINGS

Other characteristics and advantages of the invention shall appear from the following description, made with reference to be appended drawings, of which.

MORE DETAILED DESCRIPTION

Figure 1:
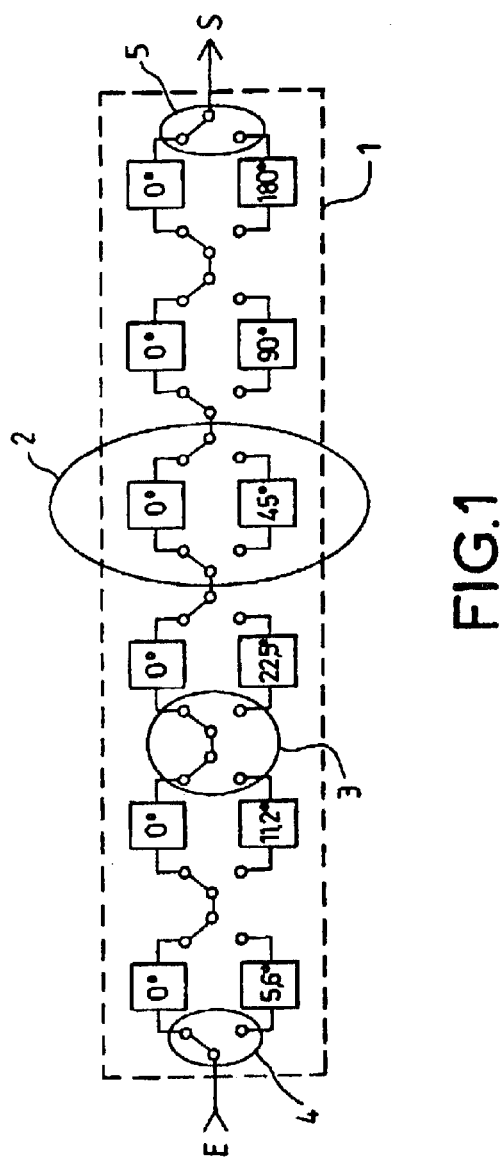
FIG. 1, exemplifies an embodiment of a phase control device comprising phase-shifting cells with two channels separated by selector switches.

FIG. 1 shows an exemplary embodiment of the phase-shifter 1 with six control bits, i.e. it comprises six phase-shift cells 2. Each cell has two channels making two different phase shifts. Each cell thus has one phase-shift channel $\phi$ and one channel making an elementary phase-shift of $\phi+360°/2^n$ where n is the rank of the control bit associated with the cell. By way of an example, it is considered that $\phi=0$. At the input to each cell, the signal is switched over to one channel or the other according to the elementary cell that the cell must apply to it. In the example of FIG. 1, it is thus possible to make one phase-shift among all the phase-shifts ranging from 0° to 360° in 5.625° steps. A selector switch 3 is placed between two consecutive cells. This is a selector switch with two inputs and two outputs. A selector switch 4, with one input channel and two output channels switches the input signal E over to one channel or the other of the first phase-shifter cell. A selector switch 5, with two inputs and one output, switches one channel or other of the last cell to the output S of the phase-shifter.

It has been stated here above that passive selector switches give rise to considerable insertion losses. The French patent application number 98 16556 discloses an active selector switch, which also has an amplification function, that can be used to get rid of these losses. This active selector switch has either one input and two outputs or two inputs and one output.

Figure 2:
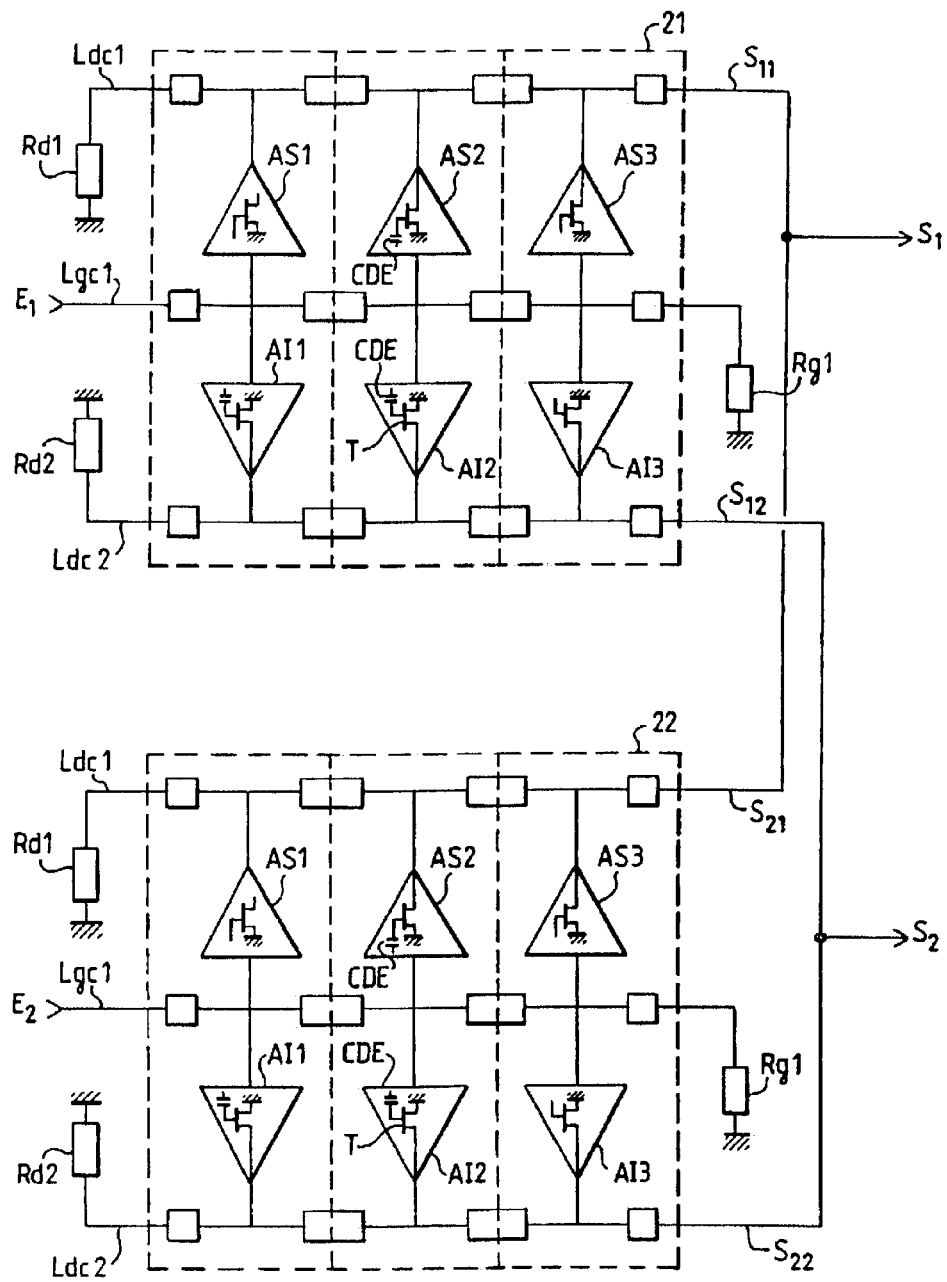
FIG. 2 shows a first exemplary embodiment of an active selector switch according to the invention.

FIG. 2 shows a first exemplary embodiment of an active selector switch according to the invention. This is a selector switch having two inputs and two outputs. A selector switch of this kind has two identical paths 21, 22 having the same structure. More specifically, each part has a distributed structure forming an active selector switch with one input and two outputs of the type described in the French patent application 98 16556. This selector switch 21, 22 is made on the principle of a distributed dual amplifier, comprising two distributed amplifiers, one upper amplifier and one lower amplifier.

Figure 3:
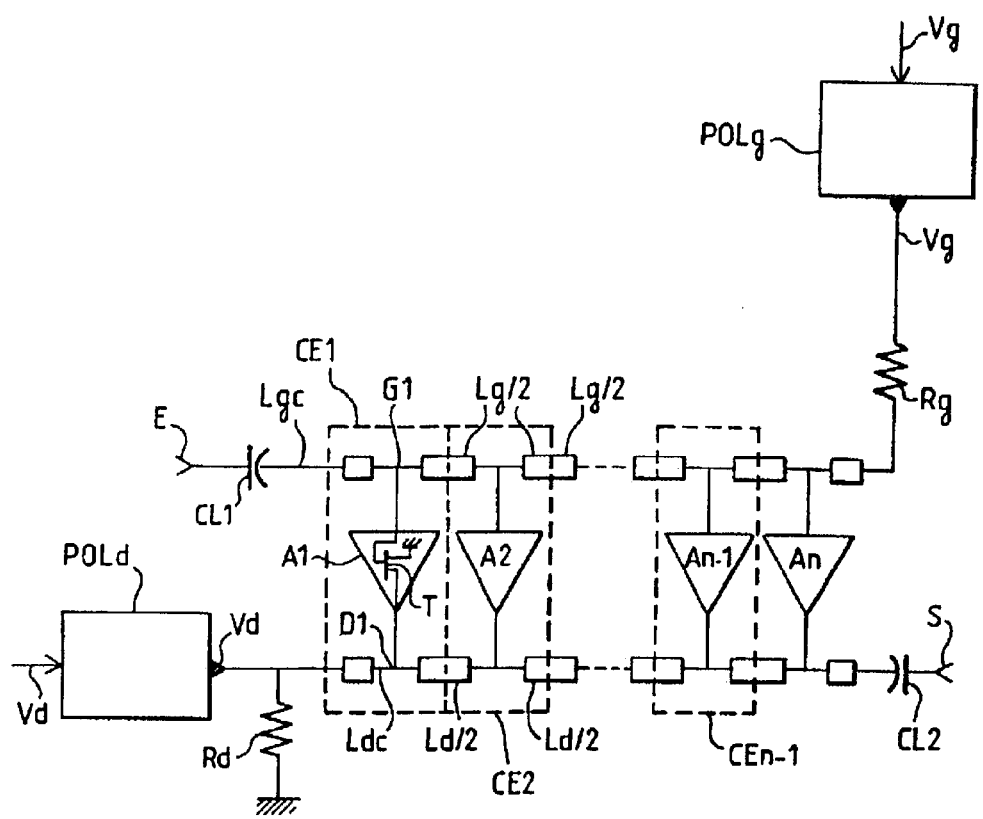
FIG. 3 shows a simple distributed amplifier comprising n amplifier cells.

FIG. 3 shows a simple distributed amplifier comprising n transistor-based amplifier cells.

To simplify the description, only the embodiments based on field-effect transistors mounted in common-source connection are described herein, but other types of transistors may be used, for example bipolar heterojunction transistors or the like.

The amplifier cells are mounted between a gate line Lgc common to which all the gates of the transistors of the amplifier cells are connected and a common-drain line Ldc on which at least the drains of the transistors of the amplifier cells CE converge.

Each amplifier cell has an amplifier structure A represented as a triangle and each constituted by one or more T transistors mounted in a common-source connection or in a cascode configuration for example. The gate of the transistor is connected to a point of the common gate line Lgc which extends between an input point of the assembly E and a resistor Rg connected to the ground. The drain of the transistor is connected to a point of the common-drain line Ldc which extends between a resistor Rd connected to the ground and an output point S of the assembly.

The points at which the transistors are connected to the common-drain line succeed one another on said common-drain line Ldc, in the same order as the connection points of said transistors, on the common-gate line Lgc.

Each amplifier cell is complemented by passive elements, especially inductors, used to constitute equivalents of sections of the drain line and of the gate line. For example, the cell CE2 comprises a section formed by Lg/2 and a capacitor Cgs and a section formed by Ld/2 and a capacitor Cds.

The head of the common gate line Lgc forms the input E of the distributed amplifier. The other end of the common gate line Lgc is charged at a terminal resistor Rg whose value is substantially equal to the characteristic impedance Zg of the common gate line Lgc. Most usually, the terminal resistance Rg is equal to 50 ohms.

Similarly, one of the ends of the common drain line Ldc is charged at the terminal resistor Rd whose value is substantially equal to the characteristic impedance Zd of the common drain line Ldc, while the other end of the common drain line defines the output S of the distributed amplifier.

Biasing means POLg apply a direct current biasing voltage Vg to the common gate line Lgc for example through the resistor Rg.

Similarly, biasing means POLd applied a direct current biasing voltage Vd to the common drain line Ldc.

The biasing means POLd or POLg may be of different types. For examples they may be a inductor of high value or a resistor or again saturable loads which may or may not be distributed.

Linking capacitors CL1 and CL2 are provided respectively between the input E and the head of the common gate line Lgc, and between the head of the common drain line Ldc and the output S of the distributed amplifier.

A distributed amplifier of the type shown in FIG. 3 works as follows:

The input signal applied to the input E is propagated on the common gate line Lgc and absorbed by the load Rg. A voltage wave therefore passes on each transistor gate, propagating from left to right, in FIG. 3. A current is then generated by each transistor. It feeds the common drain line Ldc. Part of this current propagates toward the load Rd and part of it toward the output S. the component that go to the output S get superimposed with the same phase, provided that the inter-cell propagation time is identical on the common drain line and on the common gate line. The amplification is a very great bandwidth amplification because it starts from the zero frequency and goes up to the cut-off frequencies of the filters LC formed by the gate lines and drain line with the parasitic capacitances of the transistors. These cut-off frequencies may be very high, ranging from some tens of GHz, to about 100 GHz, with appropriately designed circuits.

An active selector switch with one input and two outputs is therefore made on the principle of a distributed dual amplifier.

Referring to FIG. 2, a dual distributed amplifier 21, 22 therefore comprises a common gate line Lgc1 and two common drain lines Ldc1 and Ldc2 to make an active selector switch with one input and two outputs. The first dual amplifier 21 thus has an input $E_1$ and two outputs $S_{11}$, $S_{12}$. The input $E_1$ is common to both amplifiers, this input is the free end of the gate line, namely the end not connected for example to the ground potential through a terminal resistor Rg1. The outputs $S_{11}$, $S_{12}$ are the outputs of the amplifiers. The output $S_{11}$, $S_{12}$ of an amplifier is the free end of its drain line, namely the end is not connected for example to the ground potential through a terminal resistor Rd1, Rd2. The second dual amplifier 22 for its part has an input $E_2$ and two outputs $S_{21}$ and $S_{22}$ defined in the same way. The inputs $E_1$, $E_2$ form the inputs of the two-input selector switch.

For a dual amplifier 21, 22, the central line is the common gate line Lgc1. The lower and upper lines are the common drain lines Ldc1 and Ldc2.

Biasing means (not shown) are provided to control the transistors T of the upper amplifier structures AS (represented individually as AS1 to AS3) and lower amplifier structures Al (represented individually as Al1 to Al3), either in amplifier mode or in off mode.

For example, the biasing means are similar to those described with reference to FIG. 3.

In practice, the selector switch control between the off mode and the amplifier mode is applied to the gates of the transistors T of the upper amplifier structures AS and lower amplifier structures Al. The selection switch command can also be applied to the drains but this approach is more complex because of the drain current which entails penalties for the speed of the command. A capacitor CDE may be series-connected with the capacitor or of the gate Cgs of the transistor T to form a capacitive bridge.

As indicated here above, the two inputs of the selector switch according to FIG. 2 are the inputs $E_1$, $E_2$ respectively of the first dual amplifier 21 and of the second dual amplifier 22. To obtain the two outputs $S_1$, $S_2$ the outputs of the dual amplifier 21, 22 are cross-connected two by two. Thus, the output $S_{11}$ of the first dual amplifier 21, coming from the upper common drain Ldc1 is connected to the output $S_{21}$, of the second amplifier 22 coming from its upper common drain line Ldc1 to form a first output $S_1$. Similarly, the output $S_{12}$ of the first dual amplifier 21, coming from the lower common drain line Ldc2, is connected to the output $S_{22}$ of the second amplifier 22 coming from its lower common drain line Ldc2, to form the second output $S_2$.

There are actually four rows of amplifier structures. Most usually, only one of them is in amplifier mode, while the other three are off. It is also possible to envisage "dual" modes with the same structure by biasing two rows at the same time. The input $E_1$ can thus be connected to the outputs $S_1$ and $S_2$, or the input $E_2$ can be connected to the outputs $S_1$ and $S_2$. In both these cases, a switched divider is made, a signal that enters at $E_1$ (or $E_2$) being divided between $S_1$ and $S_2$. The two inputs $E_1$ and $E_2$ can also be connected to the output $S_1$, or the two inputs $E_1$ and $E_2$ can be connected to the output $S_2$. In the latter two cases, a switched combiner is made, and two signals reaching $E_1$ and $E_2$ get combined at the output $S_1$ (or $S_2$).

The following is the working of a distributed dual amplifier 21, 22 of the type in which the transistors T of the upper amplifier structures AS are biased in an off state while the transistors T of the lower amplifier structures AI are biased in an amplifier state, for example for the first dual amplifier 21.

The input signal applied at input $E_1$ gets propagated on the common gate line Lgc1 and then absorbed by the load Rg1. On each transistor gate of each lower amplifier structure, there therefore passes a voltage wave that gets propagated from left to right, in FIG. 2. A current is then generated by each transistor of each lower amplifier structure. This current thus generated powers the common drain line Ldc2. This current is propagated partly toward the load Rd2 and partly toward the output $S_{12}$. The components that go toward the output $S_{12}$ get superimposed with the same phase, provided that the inter-cell propagation time is identical on the common drain Ldc2 and on the gate line Lgc1. The amplification is then the combination of the applications made by each transistor of each lower amplifier structure. No current gets propagated on the common drain line Ldc1 inasmuch as the transistors of the upper amplifier structures are biased in off mode.

Similarly, by switching the bias of the lower and upper amplifier structures respectively into off mode and into amplifier mode, there is obtained a current that gets propagated toward the output $S_{11}$ and there is no current propagated toward the output $S_{12}$.

Finally, when the transistors of the upper and lower structures are all in the off state, a signal present at input $E_1$ is not transferred to any of the outputs $S_{11}$, $S_{12}$.

The routing of a signal from one input $E_1$, $E_2$ to an output $S_1$, $S_2$ of the selector switch is therefore controlled by the state of the amplifiers so as to be put into the on mode or the off mode. Controlling an amplifier to put it in the on state while the others are put in the off state routes the input of this amplifier toward the output. For example, the controlling of the upper amplifier of the first dual amplifier 21 to put it in the on state, while the other amplifiers are off, routes an input signal $E_1$ to the output $S_1$.

The selector switch can then be controlled from two control bits. The state of the first bit commands, for example, the deactivation of all the transistors of the dual amplifiers, i.e. it determines whether it is the input $E_1$ or the input $E_2$ that is switched over. This second bit controls the state of the upper and lower transistors, i.e., depending on its value, it is the upper transistors that are off and the lower transistors that are on, and vice versa. This second bit then determines the routing toward the output $S_1$ or the output $S_2$. Known interface circuits are used to connect the state of these two control bits to the biasing of the transistors. In fact the values of the two bits must be converted into four control voltages $V_{g1}$, $V_{g2}$, $V_{g3}$, $V_{g4}$, one of these voltages being taken to a value controlling the transistors associated with the amplifier state, the other three voltages being at a value that turns the associated transistors off. Each voltage will control a row of transistors by their gates. It is of course possible to activate two rows at a time to obtain switched dividers or switched combiners as described here above.

Figure 4:
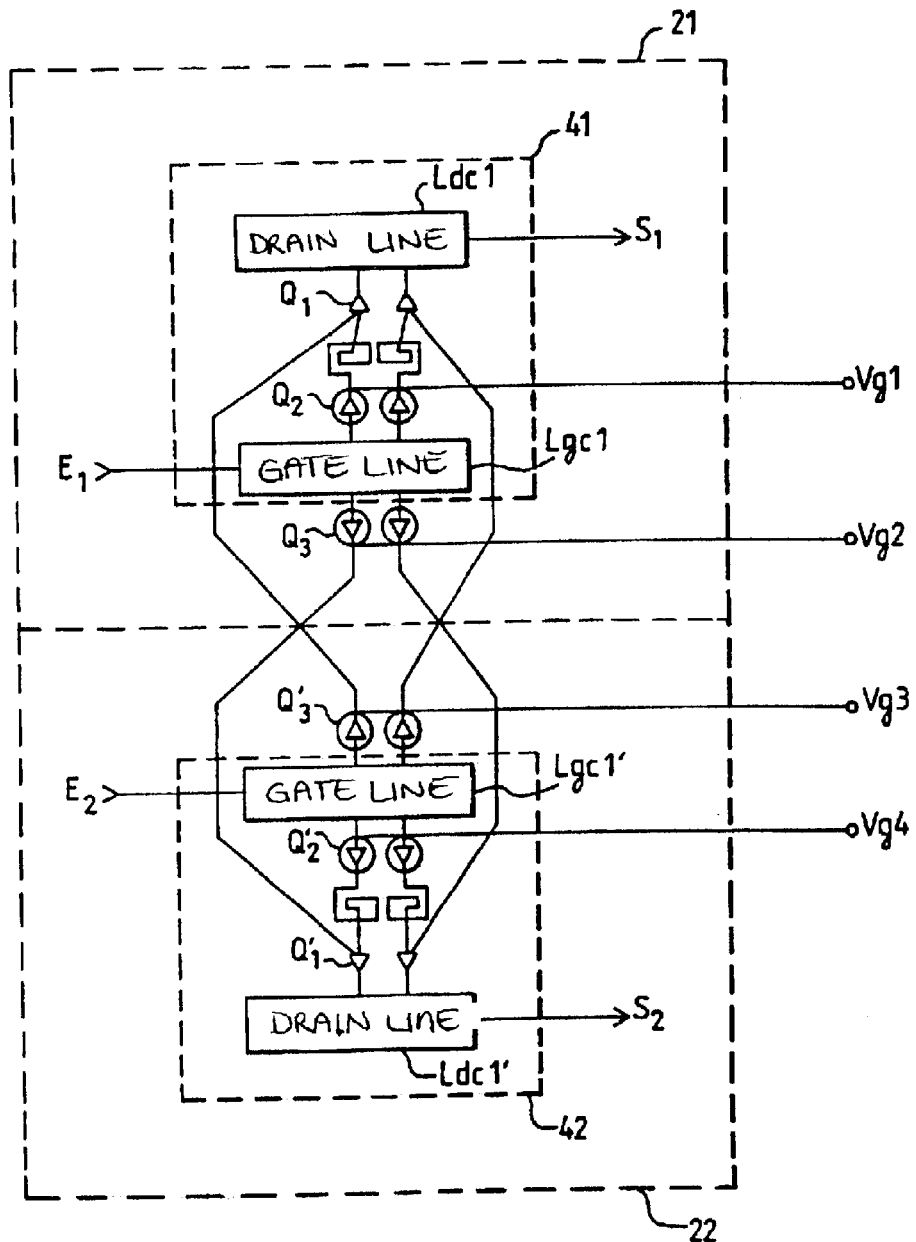
FIG. 4 is a schematic circuit diagram illustrating a second exemplary embodiment of an active selector switch according to the invention.

FIG. 4 is a schematic circuit diagram illustrating another possible embodiment of a selector switch according to the invention. As can be seen in the schematic circuit diagram, the selector switch still has two parts 21, 22, but in this embodiment, each part no longer forms a dual amplifier as in the previous embodiment. Each part has a distributed amplifier 41, 42 of the type shown in FIG. 3 where each of its cells has, for example, at least two amplifier-forming cascode-mounted transistors $Q_1$, $Q_2$. Furthermore, for each pair of transistors $Q_1$, $Q_2$, each part comprises at least one transistor $Q_3$ in a common-source connection, controlled through the gate line Lgc1 of the amplifier. The state of the transistors $Q_2$, $Q_3$, $Q'_2$, $Q'_3$ is controlled by the voltages $V_{g1}$, $V_{g2}$, $V_{g3}$, $V_{g4}$ mentioned here above.

In this embodiment, the crossed collections are no longer at the outputs, but at the links between the transistors of each cascode cell. This makes it possible especially to have only one common gate transistor $Q_1$ for two common-source transistors $Q_2$, $Q_3$ serving as selector switches through the command applied to their gate. It thus makes it possible to limit the total number of drain lines to two. This therefore makes it possible to obtain a more compact circuit. Depending on whether the transistor $Q_2$ or the transistor $Q_3$ is controlled in the on state, a signal present at input $E_1$ of the amplifier 41 is oriented toward the output $S_1$ of the amplifier or toward the output $S_2$ of the other amplifier 42, owing to the cross-connections. This cross connection is indeed such that the common-gate transistor $Q'_1$ of the second part 22 forms a cascode assembly, either with the transistor $Q'_2$ of the second part 22, or with the transistor $Q_3$ of the first part 21, depending on whether $Q'_2$ or $Q_3$ is controlled in the amplifier state. Similarly, this crossed connection is such that the common-gate transistor $Q_1$ of the first part 21 forms a cascode assembly, either with the transistor $Q_2$ of the first part 21, or with the transistor $Q'_3$ of the second part 22, depending on whether $Q_2$ or $Q'_3$ is controlled in the amplifier state. To facilitate the description, the transistors of the first part 21 are referenced $Q_1$, $Q_2$, $Q_3$ and the transistors of the second parts 22 are referenced $Q'_1$, $Q'_2$, $Q'_3$.

The two inputs of the selector switch are the inputs $E_1$, $E_2$ of the two distributed amplifiers 41, 42, at their gate lines Lgc1, that is at the free ends of the gate lines, not connected for example to a ground potential. The two outputs $S_1$, $S_2$ of the selector switch are the outputs of these two distributed amplifiers, at their drain lines Ldc1, that is, the free ends of the drain lines, not connected for example to a ground potential.

Figure 5:
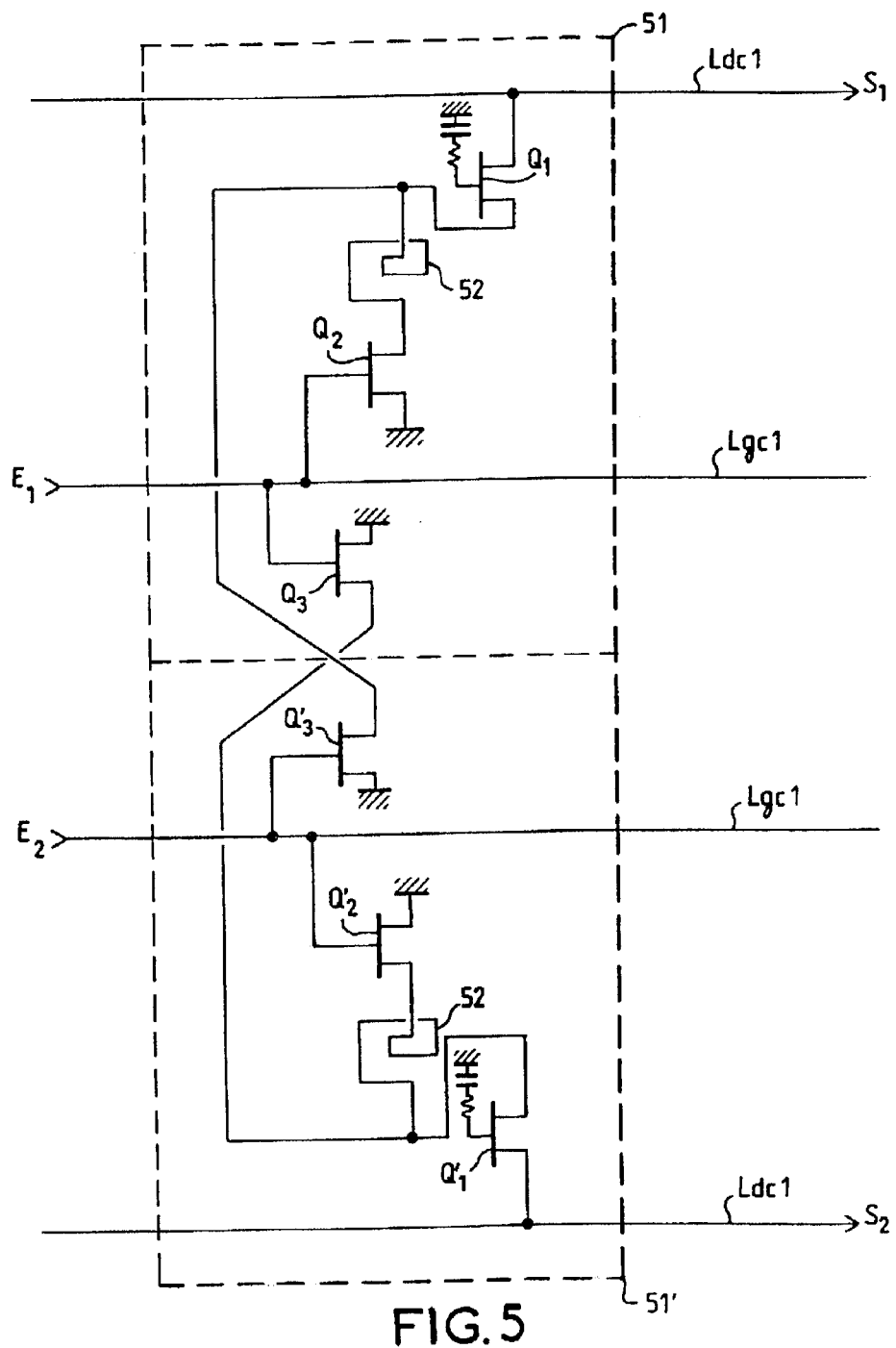
FIG. 5 is a detailed view of the connections of the active elements forming the preceding selector switch.

FIG. 5 shows the connections of the active elements, especially of the transistors, the passive elements being not shown. A single cell $51, 51'$ has furthermore been shown for each of the two parts $21, 22$ of the selector switch. The connections of the cell $51$ of the first part are crossed with the connections of the cell $51'$ of the second part. A cell $51$ comprises an elementary cell with at least two cascode-connected transistors $Q_1, Q_2$ and its associated transistor $Q_3$. Thus, for the cell of the first part $21$, the drain of the transistor $Q_1$ is connected to the drain line Ldc1 and its source is connected to the drain of the transistor $Q_2$ whose gate is connected to the gate line Lgc1. The gate of the transistor $Q_3$ is connected to the gate line Lgc1 of the other cell $51'$. The drain of this transistor $Q_3$ is also connected to the source of the transistor $Q_1$. By symmetry, the connections are identical with respect to the other part $22$. In particular, the drain of the transistor $Q_3$ is connected to the source of the transistor $Q'_1$ of the second part $22$. All the transistors have their source connected to a reference potential, for example of a ground potential. To cope with this dissymmetry of the circuit, a length of line $52$ is interposed between the source of the transistor $Q_1$ and the drain of the transistor $Q_2$. Similarly, a length of line is interposed between the source of the transistor $Q'_1$ and the drain of the transistor $Q'_2$. This length of line is formed, for example, by a spiral $52$. This spiral makes it possible especially to compensate for the difference in distance between the transistors $Q_1$ and $Q_2$ on one hand and $Q_1$ and $Q'_3$ on the other hand. The selector switch works as indicated here below.

The inputs of the first and second parts, at the gate lines, constitute respectively the input $E_1$ and the input $E_2$ of the selector switch. Similarly, the outputs of the first and second parts, at the drain lines, constitute respectively the output $S_1$ and the output $S_2$ of the selector switch. The circuit then works in one of the four following states, chosen by applying appropriate voltages to the gates of the transistors $Q_2, Q'_2, Q_3, Q'_3$.

The transistor $Q_2$ is controlled, the other transistors $Q'_2, Q_3, Q'_3$ being off, the input $E_1$ is connected to the output $S_1$ through the transistors $Q_1, Q_2$ which form an active cascode and furthermore amplify the signal.

The transistor $Q'_3$ is controlled, the input $E_2$ is connected to the output $S_1$ via the transistors $Q_1, Q'_3$ which let through and furthermore amplify the signal.

The transistor $Q'_2$ is controlled, the input $E_2$ is connected to the output $S_2$ via the transistors $Q'_1, Q'_2$ which let through and furthermore amplify the signal.

The transistor $Q_3$ is controlled, the input $E_1$ is connected to the output $S_2$ via the transistors $Q'_1, Q_3$ which let through and furthermore amplify the signal.

The transistors are, for example, cascode assemblies of elementary transistors.

The invention also relates to a phase control device formed by a sequence of phase-shifting cells with two channels separated by selector switches. One or more of the selector switches are active selector switches as defined by one of the above embodiments. In particular, the phase control device may, for example, have a structure of the type shown in FIG. 1. In a first embodiment, all the selector switches $3$ are, for example, active. In an embodiment, the selector switches are not all active, some of them being passive. Advantageously, the selector switches of the sequence are thus, for example, alternately active and passive. In particular, this solution of alternation makes it possible especially to achieve an efficient compromise between the performance of the phase-shifter unit and the surface area occupied by this unit. It has been stated here above that the use of active selector switches makes it possible to compensate especially for insertion losses. The use of active selector switches alone in the sequence of the phase control device may nevertheless create certain drawbacks. The drawback is that the switches excessively amplify a signal that crosses them. After the signal has passed through several active selector switches, it is highly amplified. It is then necessary to provide for a dimensioning of the components, i.e. of the selector switches themselves as well as of the elementary phase shifters $2$, which bear this increase in power thus produced. A direct consequence of the dimensioning especially is and increase in the surface area occupied by these components. This goes against the goal of reducing the space requirements of the phase shifters, as well as the goal of reducing cost and of course that of reducing consumption. The solution of active-passive alternation meets this goal. From the input E of the phase shifter where the signal has an initial power value $P_0$, its power increases in the first selector switch, which is for example active, up to a power value $P_1$. Its power then diminishes in the second selector switch, which is then passive, and then increases again in the next active selector switch and so on and so forth. The result of this is that, throughout the sequence and up to the output, the power that crosses the different components does not exceed or hardly exceeds the power $P_1$, and therefore remains below a permissible boundary. It is of course possible to make a passive-active-passive alternation in placing a passive selector switch at input of the phase control device. The input selector switch $4$ and output selector switch $5$, if active, are for example those described in the French patent application No. 98 16556. It is also possible to use any combination other than that entailing a strict alternation between active and passive selector switches, for example two active switches for one passive switch or vice versa, depending especially on the compromises to be made.

What is claimed is:

1. An active selector switch comprising two distributed dual amplifiers, each dual amplifier having an upper amplifier and a lower amplifier, each having a drain line (Ldc1, Ldc2) the upper and the lower amplifiers having a common gate line (Lgc1), the input ($E_1, E_2$) of an amplifier being the free end of its gate line (Lgc1) and its output ($S_{11}, S_{21}, S_{12}, S_{22}$) being the free end of its drain line, the inputs of the amplifiers forming the two inputs ($E_1, E_2$) of the selector switch, the outputs ($S_{11}, S_{21}$) of the two upper amplifiers being connected to form the first output ($S_1$) of the switch, the outputs ($S_{12}, S_{22}$) of the two lower amplifiers being connected to form the second output ($S_2$) of the selector switch, the routing of a signal from an input to an output being controlled by the state of the amplifiers.

2. An active selector switch comprising two parts, each part comprising a distributed amplifier whose elementary cells comprise at least two cascade-mounted transistors $Q_1, Q_2, Q'_1 Q'_2$, one transistor $Q_3, Q'_3$ controlled through the gate line (Lgc1) of the amplifier being associated with each cell, the common-gate transistor $Q'_1$ of the second part forming a cascode assembly either with the transistor $Q'_2$ of the second part or with the transistor $Q_3$ of the first part, depending on whether $Q'_2$ or $Q_3$ is controlled in the amplifier state, the common-gate transistor $Q_1$ of the first part forming a cascode assembly either with the transistor $Q_2$ of the first part or with the transistor $Q'_3$ of the second part depending on whether $Q_2$ or $Q'_3$ is controlled in the amplifier state, the two inputs ($E_1$, $E_2$) of the selector switch being the free ends of the gate lines (Ldc1) of the two distributed amplifiers and the outputs ($S_1$, $S_2$) of the selector switch being the free ends of these two amplifiers.

3. A selector switch according to claim 2 wherein, the first part comprising at least one cell having at least two cascode-mounted transistors $Q_1$, $Q_2$ and an associated transistor $Q_3$, the second part comprising at least one cell having at least two cascode-mounted transistors $Q'_1$, $Q'_2$ and one associated transistor $Q'_3$, the connections of the two cells are crossed so that the drain of the transistor $Q_1$ is connected to the drain line Ldc1 of its distributed amplifier and its source is connected to the drain of the transistor $Q_2$ whose gate is connected to the gate line Lgc1, the gate of the transistor $Q'_3$ being connected to the gate line Lgc1 of the other cell (51'), the drain of this transistor $Q'_3$ being connected to the source of the transistor $Q_1$, and the drain of the transistor $Q'_1$ is connected to the drain line Ldc1 of its distributed amplifier and its source is connected to the drain of the transistor $Q'_2$ whose gate is connected to the gate line Lgc1, the gate of the transistor $Q_3$ being connected to the gate line of the other cell, the drain of this transistor $Q_3$ being connected to the source of the transistor $Q'_1$.

4. A selector switch according to claim 3, wherein a line length is interposed between the source of the transistor $Q_1$ and the drain of the transistor $Q_2$ and between the source of the transistor $Q'_1$ and the drain of the transistor $Q'_2$.

5. A selector switch according to claim 4, wherein the line length is formed by a spiral.

6. A selector switch according to claim 5, wherein the transistors are cascode assemblies of elementary transistors.

7. A phase control device comprising cells having two channels performing two different phase shifts, a selector switch with two inputs and two outputs being placed between two consecutive cells, wherein the device comprises at least one active selector switch according to one of the above claims.

8. A device according to claim 7, wherein the selector switches are alternately active and passive.

* * * * *